United States Patent [19]

Hamdi et al.

[11] Patent Number: 5,272,015

[45] Date of Patent: Dec. 21, 1993

[54] WEAR RESISTANT HYPER-EUTECTIC ALUMINUM-SILICON ALLOYS HAVING SURFACE IMPLANTED WEAR RESISTANT PARTICLES

[75] Inventors: Aboud H. Hamdi, Detroit; Gerard W. Malaczynski, Bloomfield Hills; Alaa A. Elmoursi, Sterling Heights, all of Mich.

[73] Assignee: General Motors Corporation, Detroit, Mich.

[21] Appl. No.: 810,066

[22] Filed: Dec. 19, 1991

[51] Int. Cl.$^5$ ............................................... C23C 8/48
[52] U.S. Cl. ..................................... 428/472; 148/210; 148/212; 148/238; 428/446; 428/697; 428/698; 428/699; 428/704
[58] Field of Search ................ 428/698, 697, 469, 472, 428/699, 446, 704; 148/12.7 A, 12.7 B, 16.5, 16.6, 900

[56] References Cited

U.S. PATENT DOCUMENTS

| | | | |
|---|---|---|---|
| 4,244,751 | 1/1981 | Hioki et al. | 148/222 |
| 4,364,969 | 12/1982 | Dearnaley et al. | 427/38 |
| 4,451,302 | 5/1984 | Prescott et al. | 148/437 |
| 4,556,607 | 12/1985 | Sastri | 106/286.3 |
| 4,698,237 | 10/1987 | Macintyre | 148/242 |
| 4,764,394 | 8/1988 | Conrad | 427/38 |
| 4,769,291 | 9/1988 | Belkind et al. | 428/34 |

FOREIGN PATENT DOCUMENTS 60-56061  4/1985  Japan .

OTHER PUBLICATIONS

Hickl, "An Alternate to Cobalt-based Hardfacing Alloys", Journ. of Metals, Mar. 1980, pp. 6–12.

Okada, T., et al., "Friction and Wear of Nitrogen Implanted Aluminum Alloy Based FRM", Nuclear Instruments and Methods in Physics Research B37/38, (1989), 724–727.

Appleton, Bill R., et al., "Ion-Beam and Laser-Induced Surface Modifications", Materials Science and Engineering, 70, (1985), 23–51.

Primary Examiner—A. A. Turner
Attorney, Agent, or Firm—George A. Grove

[57] ABSTRACT

Hyper-eutectic aluminum-silicon alloys are surface treated with nitrogen and carbon by ion implantation means so as to form hard, wear resistant particles of silicon nitride and silicon carbide which are surrounded by a hard matrix of aluminum nitride and aluminum carbide, depending on the species implanted. During applications where wear resistance is required, the hard silicon-based particles provide the wear resistant phase, thereby shielding the surrounding aluminum-based matrix. Yet the modified aluminum-based matrix is also sufficiently hard so as to provide strength and support for the silicon-based particles. Substantial improvements in wear resistance are obtained for these hyper-eutectic aluminum-silicon alloys, as compared to conventional alloys which have not been treated in accordance with this invention.

8 Claims, 2 Drawing Sheets

WEAR RESISTANT HYPER-EUTECTIC ALUMINUM-SILICON ALLOYS HAVING SURFACE IMPLANTED WEAR RESISTANT PARTICLES

The present invention generally relates to hyper-eutectic aluminum-silicon alloys which have been surface treated by ion implantation methods for improved wear resistance. More particularly, this invention relates to the surface treatment of components formed from such a hyper-eutectic aluminum-silicon alloy, wherein the surface of the alloy component is characterized by a uniform distribution of wear resistance particles, in the form of silicon nitride or silicon carbide, which are surrounded by a hard aluminum matrix, such that the surface treated component exhibits significantly improved wear resistance.

BACKGROUND OF THE INVENTION

The use of ion implantation methods for the modification of a material's surface are known. Generally, ion implantation techniques involve forming a beam of ions and then accelerating the ions to a high energy before they are directed into the surface of a solid target. The conventional ion implantation methods are "line-of-sight", meaning that only those regions of the target directly in line with the focused beam receive the ion bombardment. This technique requires that the ions impinge the target at a plane which is as close to perpendicular as possible, relative to the focused beam, so as to reduce the amount of back-sputtering at the target. Back-sputtering of the ionic dosage is undesirable in that it correspondingly decreases the amount of retained ion dose within the target.

Therefore in order to ion implant a complex three-dimensional component, the component must be manipulated within the implantation chamber so as to expose all desired surfaces to the focused beam. In addition, any convex surfaces must be masked so as to prevent this detrimental sputtering effect. These additional procedures required when working with complex three-dimensional components, have generally prohibited the widespread, high volume use of ion implantation methods for surface modification of these types of components.

U.S. Pat. No. 4,764,394 to Conrad, entitled "Method and Apparatus for Plasma Source Ion Implantation", Aug. 16, 1988, teaches an improved method for ion implantation, particularly suited for use with three dimensional targets. Instead of the use of a focused ion beam which impinges the target on a "line-of-sight" basis, Conrad forms an ionized plasma which essentially envelopes the target, thereby making possible the ion implantation of complex, three-dimensional shaped components without the previous requirement for manipulation or masking of the component. With the method of Conrad, high volume, ion implantation of complex components appears to be possible.

To date, ion implantation methods have been useful for improving the friction, wear and corrosion resistance properties of many materials. Specifically, ion implantation methods have been a useful means for enhancing the surface wear resistance of tool steels and other alloys employed in wear resistant applications, as well as ceramics and plastics. However, aluminum alloys have been noticeably absent from the list of materials successfully treated by ion implantation. Aluminum alloys have been conventionally treated with various surface coatings such as stainless steel for enhanced wear resistance, which can be unduly expensive. Yet, an ion implanted, surface-enhanced aluminum alloy would be a desirable alternative in many applications because of aluminum's high strength-to-weight ratio. A surface-treated wear-resistant aluminum alloy would be a potential candidate for many applications where more expensive and/or heavier, wear resistant parts are currently being used, including in many automotive applications.

Applicants have determined that a preferred ionic species for implantation within an aluminum alloy might probably be that of nitrogen or carbon, particularly if the aluminum alloy contained a relatively high silicon content. This would preferably result in the formation of silicon nitrides and silicon carbides at the surface of the aluminum alloy, which is the region where wear resistance is required. However, to date, attempts to implant these ionic species within an aluminum alloy have been unsuccessful, if even attempted at all. The art has generally not viewed the surface treatment of hyper-eutectic aluminum alloys by ion implantation as a viable alternative for wear resistant applications.

Previous attempts have included the ion implantation of nitrogen into an aluminum alloy having a low silicon concentration and reinforced by silicon carbide fibers. An improvement in the wear resistance of the fiber reinforced alloy was observed. However, the implantation of nitrogen into the aluminum matrix enhanced the wear resistance of the alloy only because of the formation of an aluminum nitride metal soap phase which added to the lubricity of the component, while the silicon carbide fibers which were originally present within the alloy continued to provide the hard, wear resistant phase. In particular, where the alloy did not contain the reinforcing silicon carbide fibers, but had been ion implanted with nitrogen, the alloy tended to "plough" and deform during the wear resistance test, therefore indicating that without the reinforcing original silicon carbide fibers, the wear resistance of the alloy was not enhanced by the ion implantation of nitrogen.

Also, ion implantation of nitrogen and some other species into pure aluminum has been attempted in the semiconductor fields. The resulting aluminum nitride is characterized by good thermal conductivity properties, thereby making it a useful insulator within a semiconductor. However, these teachings have not been helpful to the formation of a wear resistant aluminum alloy component.

Therefore, it would be desirable to provide an aluminum alloy having enhanced wear resistant properties, preferably due to the formation of hard wear resistant particles, such as silicon nitride or silicon carbide particles, at the surface of the material. In addition, it is also preferred that the ion implantation be accomplished by the plasma source ion implantation methods of Conrad, so that complex parts could be readily treated in a high production environment such as for automotive applications.

SUMMARY OF THE INVENTION

It is therefore an object of this invention to provide a wear resistant component formed from a hyper-eutectic aluminum-silicon alloy.

It is a further object of this invention that such a wear resistant component formed from the hyper-eutectic aluminum-silicon alloy be characterized by the uniform presence of silicon nitride and/or silicon carbide particles at or near its surface.

It is yet a further object of this invention that such a wear resistant hyper-eutectic aluminum-silicon alloy component be formed by ion implantation of nitrogen or carbon into the surface of the component.

In accordance with a preferred embodiment of this invention, these and other objects and advantages are accomplished as follows.

A wear resistant component formed from a hyper-eutectic aluminum-silicon alloy, and having uniformly distributed wear resistant particles at or near its surface, which are surrounded and supported by a strong hard matrix, is provided. The wear resistant component is particularly suitable for use as a piston, or other type of component, where good wear resistance is required.

The hyper-eutectic aluminum-silicon component is surface treated with ion implantation techniques. The preferred ionic species for implantation into the hyper-eutectic aluminum-silicon alloy were nitrogen and carbon for formation of the silicon nitride and silicon carbide particles, and for the hardening of the surrounding aluminum matrix. Heretofore, aluminum alloys have not been treated in this manner so as to form hard wear resistant particles within a surrounding hard, supportive matrix.

As stated, the wear resistant particles are particles of silicon nitride and/or silicon carbide, and are surrounded by a hard supporting matrix of aluminum nitride and/or aluminum carbide, depending on the ionic species implanted. Therefore during rubbing applications where wear resistance is required, the hard silicon-based particles provide the wear resistant phase, thereby shielding the surrounding aluminum-based matrix from excessive wear and deformation. Yet the aluminum-based matrix which has also been modified with the nitrogen or carbon is also sufficiently hard so as to provide strength and support for the silicon-based particles.

The preferred method for ion implantation was by means of the plasma source ion implantation techniques disclosed by Conrad in U.S. Pat. No. 4,764,394. With this method, complex three dimensional parts formed from the preferred hyper-eutectic aluminum silicon alloys may be readily ion implanted for formation of the wear resistant particles at their surface. The use of this method facilitates the production of complex parts on a high volume scale, which may be useful for certain applications such as automotive applications.

Particularly advantageous features of this invention are that the silicon nitride and silicon carbide particles are uniformly dispersed throughout the surface region of the aluminum-silicon alloy of this invention, thereby enhancing the wear resistance of the component formed from such a material. In addition, the strength of the surrounding aluminum matrix is greatly improved by the formation of aluminum nitride or aluminum carbide at this surface region, depending on the ionic species implanted. This strong aluminum matrix in this surface region provides ample support for the wear resistant, hard silicon-based particles. Therefore the silicon-based particles provide the wear resistance without any deformation of the surrounding matrix.

Sliding wear resistance tests showed substantial improvements in wear resistance of the aluminum alloys having the surface implanted silicon nitride and silicon carbide particles in accordance with this method, as compared to conventional hyper-eutectic aluminum-silicon alloys.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings wherein.

DETAILED DESCRIPTION OF THE INVENTION

Figure 1:
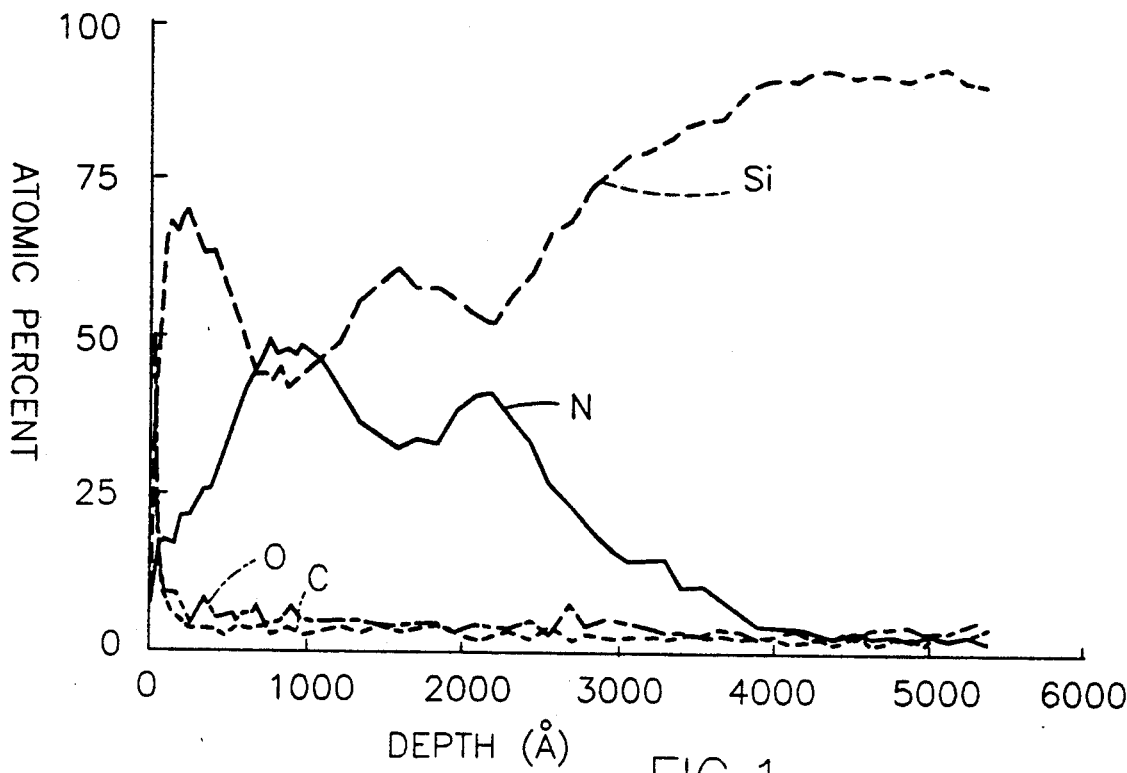
FIG. 1 is a graph showing the depth profile of nitrogen and other elemental species in a silicon nitride phase within a nitrogen-implanted alloy in accordance with this invention.

According to the present invention, a wear resistant component formed from a hyper-eutectic aluminum-silicon alloy is provided. The component is characterized by uniformly distributed wear resistant particles at or near its surface which are surrounded by a strong hard supportive matrix.

The aluminum-silicon alloys which were treated in accordance with this invention were aluminum alloy Al-390, having a silicon content of about 16-18 weight percent, and aluminum alloy Mahle-124, having a silicon content of about 11-13 weight percent. In particular, the nominal elemental compositions of these alloys are shown in Table I., wherein the amounts refer to weight percentages.

TABLE I

| Element | Al-390 | Mahle-124 |
|---------|--------|-----------|
| Si | 16-18 | 11-13 |
| Cu | 4-5 | 0.8-1.5 |
| Mg* | 0.35 (max) | 0.8-1.3 |
| Ni* | 0.1 (max) | 0.8-1.3 |
| Fe* | 0.9 (max) | 0.7 (max) |
| Mn* | 0.45-0.65 | 0.3 (max) |
| Ti* | 0.2 (max) | 0.2 (max) |
| Zn* | 0.9 (max) | 0.3 (max) |
| Cr* | 0.1 (max) | |
| Pb* | 0.1 (max) | |
| Sn* | 0.1 (max) | |
| Al | Balance | Balance |

*The total of these element constituents does not exceed about 3.4 weight percent.

Although these two alloys were employed for experimentation purposes to substantiate this invention, the teachings of this invention are in no way limited to only these two alloys. In general, the aluminum alloy should be of the hyper-eutectic type. The hyper-eutectic point in a pure aluminum-silicon system is approximately 12.3 weight percent silicon within the pure aluminum. However due to the additional constituents within most of these types of alloys, it is believed that the actual hyper-eutectic point may decrease greatly within these aluminum alloys, possibly as low as about ten weight percent. Maintaining the level of silicon above the hyper-eutectic point ensures that primary silicon particles will form in the alloy, before any subsequent implantation. The relatively high silicon content, and primary silicon particles, are desired since the improved wear resistance of the components depend upon the formation of silicon nitrides and/or silicon carbides after ion implantation of the nitrogen and/or carbon. Therefore, even though the teachings of this invention are applicable to a lower level of silicon, the lower level of silicon would not result in the formation of the hard wear resistant particles of silicon nitride and/or carbide during implantation.

Thus, the preferred silicon content within an aluminum-silicon alloy which would be suitable for surface treatment in accordance with this invention is ten weight percent or greater. Practically, the maximum level of silicon within these types of alloys is not going to exceed about 20 weight percent, since a concentration greater than this detrimentally affects the overall properties of the material. Virtually any other alloying elements may be included within the aluminum-silicon alloy, thereby permitting the use of this invention with a variety of aluminum-silicon alloys.

For each of the two alloys tested, Al-390 and Mahle-124, samples were prepared wherein each sample had two surfaces which could be used for evaluation of the material. The samples were in the shape of blocks having dimensions of approximately $\frac{1}{4}" \times \frac{1}{4}" \times \frac{1}{2}"$. One of the surfaces was surface treated by ion implantation in accordance with this invention, the other surface was not treated for comparative purposes. The blocks were subsequently evaluated for wear resistance using a Faville-Levally Falex Block-on-Ring wear tester.

The aluminum-silicon samples were surface treated with ion implantation techniques. The preferred ionic species for implantation were nitrogen and carbon for formation of the silicon nitride and silicon carbide particles, and for the hardening of the surrounding aluminum matrix.

A Zymet Z100 ion implanter was employed for the nitrogen implant. This ion implanter had no magnetic mass analyzer, therefore resulting in the implantation of all possible nitrogen ions from the source, i.e., $N^+$, N, $N_2+$ and $N_2$. It is foreseeable that only a single nitrogen ion would be implanted, therefore requiring the use of some type of ionic separator, such as a magnetic separator.

For the carbon implant the ions were magnetically selected to implant only $C^+$ ions using a Varian/Extrion implanter. Separation of the carbon ions is not necessary, if desired.

Nitrogen and carbon ion implantation were performed at about 100 kiloelectron Volts (keV) for a duration sufficient to produce an ionic dosage of about $2 \times 10^{18}$ ions/centimeter$^2$ (ions/cm$^2$) and $1 \times 10^{18}$ ions/cm$^2$, respectively within the samples. Only one surface of each sample was treated by the implantation. These ion dosages corresponded to various depths within the two alloys, depending on the microscopic location of the ionic dosage (i.e., implantation of the bulk aluminum matrix versus implantation of the primary silicon particles), and will be discussed more fully later.

It should be noted that practically any ion dosage and corresponding depth of ionic penetration can be achieved, so long as the implantation machine is capable of sustaining a sufficient operating voltage. The ionic dosages described above were sufficient to substantially increase the wear resistance of these materials, however, it is foreseeable that suitable results could also be achieved with an ionic dosage of at least about $5 \times 10^{17}$ ions/cm$^2$ for either the nitrogen or carbon implantation.

The preferred method for ion implantation was in accordance with the plasma source ion implantation techniques disclosed by Conrad in U.S. Pat. No. 4,764,394, incorporated herein by reference, although any of the ion implantation methods known now or in the future, could foreseeably be used with successful results achieved. Generally, with the Conrad method, ion implantation into surfaces of three dimensional targets is achieved by the formation of an ionized plasma about the target within an enclosing chamber. A pulse of high voltage is applied between the target and the conductive walls of the chamber. Ions from the plasma are driven into the surfaces of the target object from all sides simultaneously without the need for manipulation of the target object. Repetitive pulses of high voltage, typically about 20 kilovolts or higher, causes the ions to be driven deeply into the target. The plasma may be formed of a neutral gas introduced into the evacuated chamber and ionized therein with ionizing radiation, so that a constant source of plasma is provided which surrounds the target object during the implantation process.

There was no intentional heating of the samples during the ion implantation process, however, no precautions were taken to prevent heating or to provide a heat sink for the samples during implantation either. This was done to simplify the process and to evaluate its production feasibility where it would be undesirable to require a heat sink for each component. From the subsequent metallographic analysis of the materials, no appreciable thermal energy was generated within the components.

The wear resistance of the sample blocks having an implanted surface and non-implanted surface, formed from both alloys, were evaluated using sliding wear resistance tests. The sliding wear resistance tests were performed on a Faville-Levally Falex Block-on-Ring wear tester. The test conditions were as follows: a uniform load of about $2 \times 10^7$ Pascals (approximately 300 pounds per square inch) was applied to the sample block which contacted the standard ring rotating at about 500 revolutions per minute (rpm). These parameters were chosen to simulate the practical conditions experienced by exemplary aluminum components used in automotive applications.

The results of these tests were in the form of wear depth versus time. The tests were terminated once the wear depth of approximately 50 micrometers (about 0.002 inch) was achieved. The non-implanted surface of each sample was also tested under the same conditions for comparative purposes.

Before implantation, optical micrography revealed that the Al-390 aluminum alloy exhibited larger grain sizes for the primary silicon particles than the Mahle-124 alloy. This corresponds to the relative concentrations of silicon within each alloy, i.e., the Al-390 has a higher concentration of silicon. Additional optical analysis was performed on the wear tested areas from samples of both alloys that were implanted with the carbon and the nitrogen. Generally, the wear streaks in the Mahle-124 samples were more pronounced than those in the Al-390 samples, indicating greater wear in the Mahle-124 alloy. This is believed to be due to the presence of larger primary silicon grains within the high silicon content Al-390 alloy. The larger primary silicon grains provide an inherent shield for the aluminum matrix during wear applications and therefore better wear resistance.

Within the Al-390 alloy samples, the wear streaks within the carbon implanted samples appeared to be less severe than the wear streaks within the nitrogen implanted samples. This correlates to the generally known principle that the hardness of carbides is generally higher than that of nitrides, corresponding to better wear resistance.

Thin film analysis using Auger Electron Spectroscopy was also performed on the implanted samples before and after the sliding wear resistance tests. The Auger analysis was employed to determine the depth of implantation and composition of the implanted samples.

Shown in FIG. 1 is an elemental depth profile for a silicon grain within the nitrogen-implanted Al-390 alloy before the wear test. As noted, the silicon content remains high throughout the depth profile, as evidenced by the profile line represented by the designation "Si". The nitrogen profile represented by the line having a designating letter "N" shows a distribution within the sample having a double Gaussian peak. The depth of the first peak is approximately half the depth of the second peak within the thin film sample. This is expected when implanting multiply charged mono- and di-nitrogen ion species. The first Gaussian peak is centered at about 900 Angstroms and is due to singly ionized nitrogen. The tail of the first Gaussian peak which extends beyond about 3000 Angstroms contains a second Gaussian peak associated with the doubly ionized nitrogen species (N). The Gaussian peaks maintained their shapes as a result of the low thermal diffusivity of nitrogen into silicon. From FIG. 1, it can be seen that the nitrogen implanted to a depth of about 4000 Angstroms within the silicon grain for the preferred ionic dosage, with a high concentration of the silicon nitride probably being located between the surface and about 2500 Angstroms.

The compositional analysis of the silicon grain suggested that silicon nitride ($Si_3N_4$) has been partially formed as a result of nitrogen implantation. Additional qualitative evidence supporting the formation of silicon nitride was obtained by comparing the lineshape for the nitrogen KLL elemental orbital subshells in the implanted sample to the nitrogen KLL lineshapes measured from a silicon nitride standard. The lineshapes for the subshells were similar. Therefore it is believed that silicon nitride was formed from the nitrogen implantation.

It is noted that the other elemental profiles for oxygen and carbon are shown in FIG. 1 to indicate the level of contamination by these elements during ion implantation.

Figure 2:
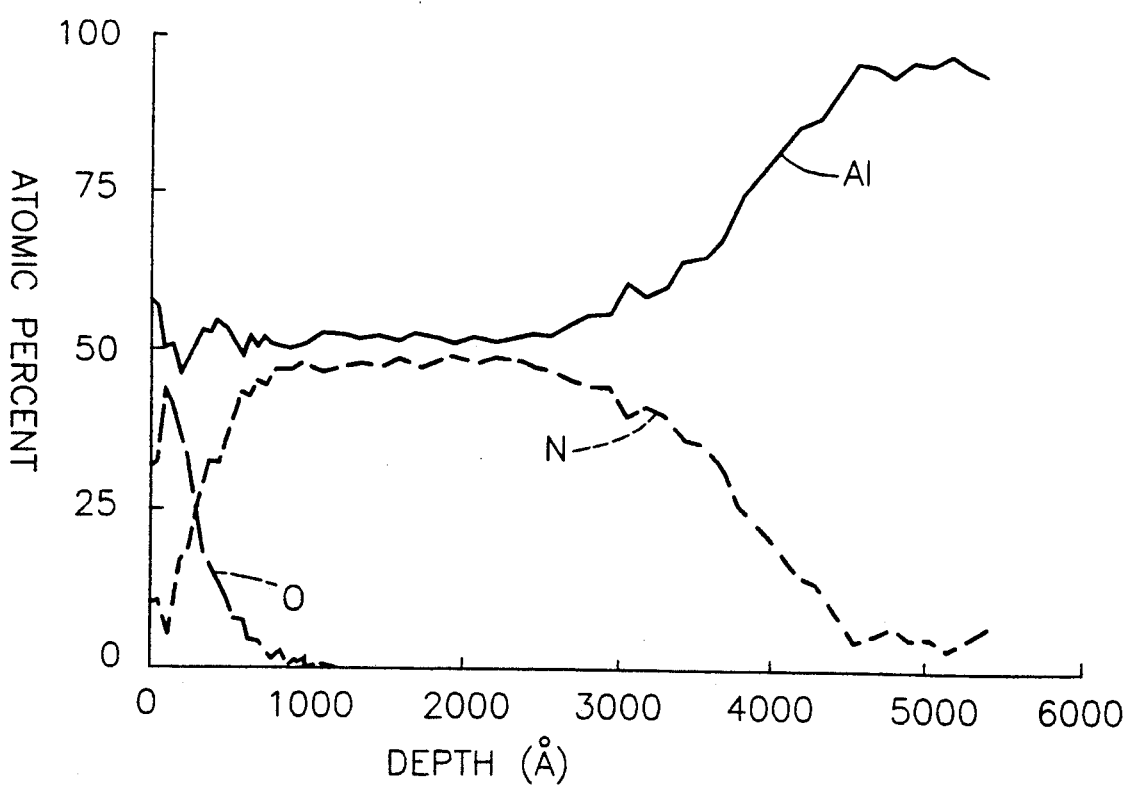
FIG. 2 is a graph showing the depth profile of nitrogen and other elemental species in the bulk aluminum matrix within a nitrogen-implanted alloy in accordance with this invention.

FIG. 2 shows the elemental depth profile of nitrogen within the bulk aluminum matrix phase within the Al-390 alloy, as evidenced by the high concentration of aluminum at all depths represented by the profile line designated by "Al". As shown, the nitrogen profile does not show the existence of the Gaussian peaks observed in FIG. 1. This is due to the high thermal diffusion coefficient of nitrogen into aluminum. Therefore, the nitrogen diffuses rapidly through the aluminum matrix to a penetration of about 4500 Angstroms. In addition, the nitrogen reacts with the aluminum to form aluminum nitride (AlN). As shown in FIG. 2, the nitrogen is present in an amount which does not exceed the stoichiometric ratio of 1:1 for aluminum nitride. A comparison of this sample with the standard nitrogen KLL lineshapes for aluminum nitride were again similar, thereby strongly suggesting the formation of aluminum nitride within the implanted material, particularly between the surface and about 3000 Angstroms. Similar results were observed for the nitrogen implanted Mahle-124 alloy. The oxygen profile shown in FIG. 2 was determined to indicate the level of oxygen contamination during ion implantation.

Figure 3:
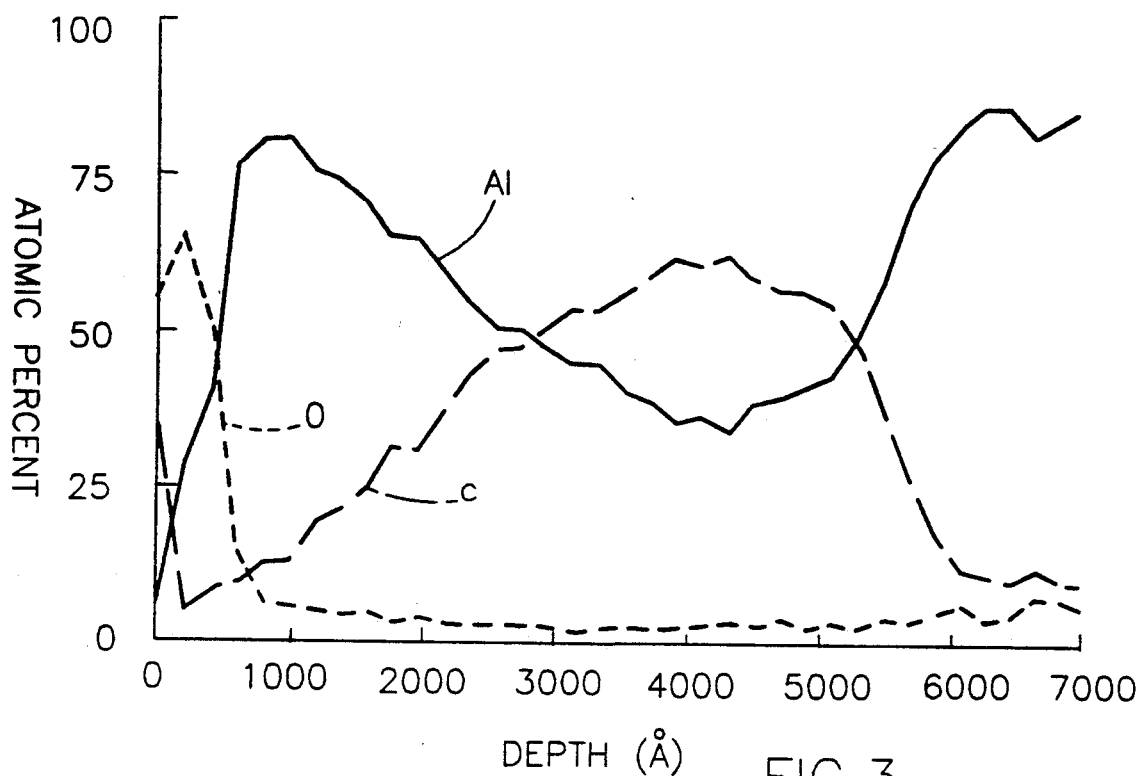
FIG. 3 is a graph showing the depth profile of carbon and other elemental species in the bulk aluminum matrix within a carbon-implanted alloy in accordance with this invention.

FIG. 3 shows the elemental depth profile for the bulk aluminum matrix in a Mahle-124 sample which was implanted with carbon. The concentration of carbon at approximately 2500–3000 Angstroms appears to exceed the stoichiometric ratio of aluminum carbide ($Al_4C_3$). This suggests the possibility of carbon segregation within the aluminum matrix past this depth, with the aluminum carbide being formed between the surface and this depth. Auger lineshape analysis with standard aluminum carbide, shows evidence of hard aluminum carbide formation despite some possible segregation of the carbon within the aluminum matrix. The oxygen profile was again determined to indicate the level of oxygen contamination during ion implantation.

Figure 4:
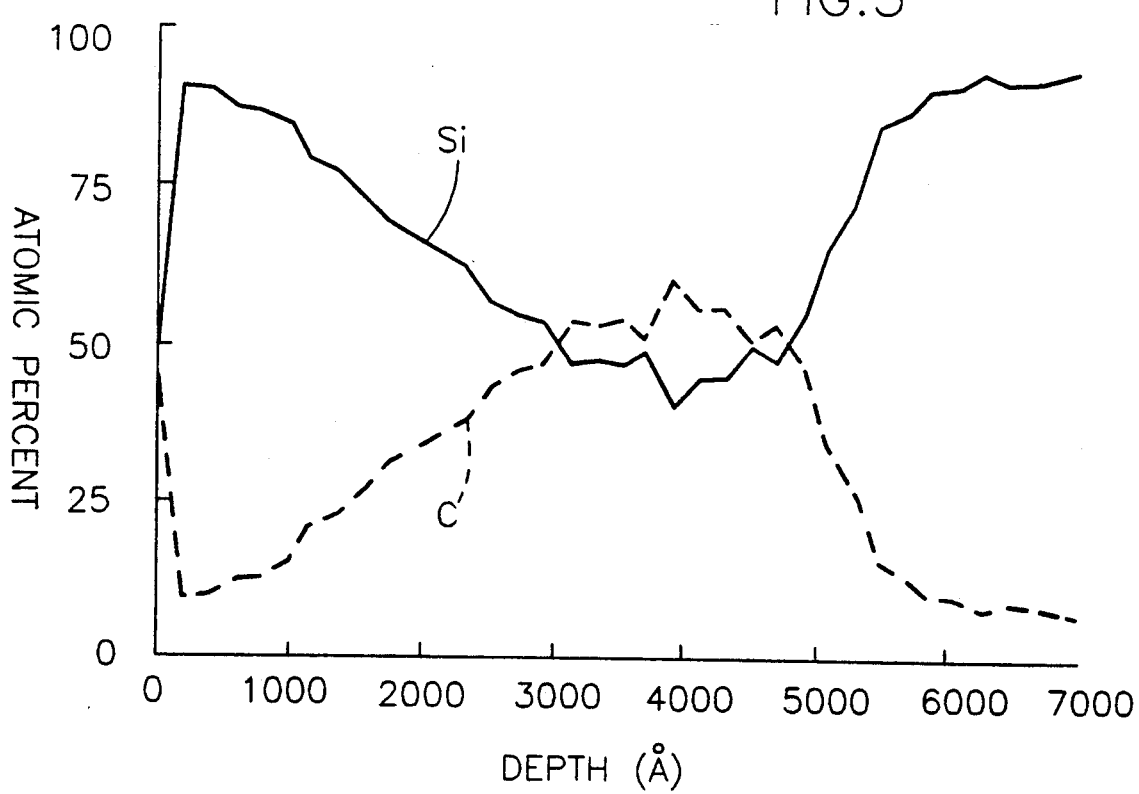
FIG. 4 is a graph showing the depth profile of carbon and other elemental species in a silicon carbide phase within a carbon-implanted alloy in accordance with this invention.

The elemental depth profile of a silicon grain within the same carbon-implanted Mahle-124 sample is shown in FIG. 4. The compositional ratio of silicon to carbon is slightly higher than one suggesting that silicon carbide was formed. Therefore it is believed that silicon carbide is formed. In addition, it is possible that a portion of the carbon atoms may form clusters within the silicon above a saturation level, which would not be transformed into silicon carbide, even if subsequent annealing were performed.

After wear testing, elemental depth profiles of the wear tested areas in the Al-390 and Mahle-124 alloys were performed and showed the absence of the implanted species in the bulk aluminum matrix, as well as in the primary silicon grains. This is not surprising since the wear depths, about 50 micrometers, were significantly greater than the implant depths, of at most approximately 6 micrometers.

The results of the sliding wear resistance tests are summarized in Table II as follows. Generally, the ion-implanted aluminum alloys showed superior wear resistance as compared to the non-implanted alloys. These results are believed to be due to the formation of the silicon carbides and silicon nitrides within the alloys.

TABLE II

| Material | Implant Species | Time to Failure (minutes)* |
| --- | --- | --- |
| Mahle-124 | none | 10, 15 |
| Mahle-124 | Nitrogen | 26, 18, 64, 114 |
| Mahle-124 | Carbon | 532, 103 |
| Al-390 | none | 123, 158 |
| Al-390 | Nitrogen | 250, 1154, 4930 |
| Al-390 | Carbon | 322, 3828 |

*Failure was determined once a wear depth of 50 micrometers (about 0.002 inch) was attained.

Generally, the carbon and nitrogen-implanted Al-390 alloy showed higher wear resistance as compared to the Mahle-124 alloy which was implanted under the same conditions. The large primary silicon grain size within the Al-390 alloy corresponds to larger silicon carbide and nitride grains after implantation, which enhance the wear resistance of the bulk aluminum matrix. However, as stated previously, significant improvements are obtained with either aluminum alloy after implantation as compared to the non-implanted samples.

It is believed that the hard, wear resistant particles of silicon nitride and silicon carbide surround the hard matrix of aluminum nitride and/or aluminum carbide, analogously providing a protective shield over the bulk matrix of the alloy during wearing applications, while also providing the hard, wear resistant phase within the alloy. Yet the aluminum-based matrix which has also been modified with the nitrogen and carbon, to form ceramic-like aluminum nitride or aluminum carbide, is sufficiently hard so as to provide a strong support for the silicon-based particles. This combination of the hard wear resistant phases surrounded by a hard supportive matrix is believed to be the reason why wear resistance is so significantly improved by this invention.

For the Mahle-124 alloy, the nitrogen implantation improved the time-to-failure by a factor ranging from about 1.4 to about 5, while the failure time for the same alloy implanted with carbon improved by a factor of about 8 to about 42. The corresponding nitrogen implanted Al-390 alloy showed an improvement in the time-to-failure of about 1.8 to about 35, while for the carbon implantation the improvement factor varied from about 2.3 to about 20.

It is believed that the reason the results of the wear test are so scattered is due to the initial wear rate during the first portion of the wear test, believed to be about the first ten minutes. It is believed that during the initial wear of the alloy material, the component seats itself into a particular grooved pattern against the rubbing member. The particular grooved pattern depends on the particular surface features present on the alloy, on a microscopic level. If the surface is characterized by a high amount of the hard silicon carbide/nitride particles, then the grooved pattern would probably be less severe than if the surface was characterized by more of the aluminum matrix. After this initial wear is completed, the wear rate becomes generally constant for a given alloy and type of implantation. Regardless of the scattered wear data, the tests are indicative that the surface treatment of this invention significantly improves the wear resistance of these alloys.

Also, it is to be noted that the wear resistance of the two alloys was significantly improved, even in those regions deeper than the ion penetration within the alloy. The wear tests were performed until 50 micrometers of wear was detected, whereas the range of the implanted ions was submicron. It is believed that the improved wear resistance of the two alloys, even though beyond the range of the implanted ions, is due to some radiation damage within the alloy from the ion implantation. It is believed that the ionic species, particularly the nitrogen, diffuses into the alloy as wear progresses, thereby enhancing the alloy properties.

In addition, wear tests were performed on the non-implanted surface of the implanted samples. The wear tests on the non-implanted surface also showed an improvement in wear resistance over the same alloy having no surface treatment. This is believed to be due to a self-annealing effect which occurs during the ion implantation, therefore suggesting that some heating of the material does occur during the implantation.

Therefore with this invention, silicon nitride and silicon carbide particles are formed within aluminum alloys having a silicon content greater than about ten weight percent. The hard silicon nitride and silicon carbide particles are uniformly dispersed throughout the surface region of the aluminum-silicon alloy, thereby enhancing the wear resistance of the component formed from such a material. In addition, the strength of the surrounding aluminum matrix is also significantly improved by the formation of aluminum nitride and aluminum carbide at this surface region, thereby this strong aluminum matrix provides ample support for the wear resistant, hard silicon-based particles, resulting in significantly improved wear resistance without any deformation of the surrounding matrix. Components treated in accordance with this invention could be useful in many wear resistant applications, such as a piston within an internal combustion engine.

Therefore, while our invention has been described in terms of a preferred embodiment, it is apparent that other forms could be adopted by one skilled in the art, such as by substituting other aluminum-silicon alloys having a silicon content greater than about 10 weight percent, or by modifying the ion dosages or processing steps so as to implant both nitrogen and carbon within an alloy, or by employing the treated alloys in alternative types of environments. Accordingly, the scope of our invention is to be limited only by the following claims.

The embodiments of the invention in which an exclusive property or privilege is claimed are defined as follows:

1. A wear resistant article formed from a hyper-eutectic aluminum-silicon alloy, said article comprising:
   a silicon content of at least about ten weight percent;
   silicon nitride particles located proximate to the surface of said article; and
   a hard aluminum-nitride matrix substantially surrounding said silicon nitride particles;
   said silicon nitride particles being formed by ion implantation of at least one ionic nitrogen species into said surface of said article, wherein said implanted ionic nitrogen specie sufficiently reacts with said silicon to form said silicon nitride particle, and said implanted ionic nitrogen specie also sufficiently reacting with the aluminum matrix to form said hard aluminum-nitride matrix which substantially surrounds said silicon nitride particles, such that said article exhibits enhanced wear resistance.

2. A wear resistant article formed from a hyper-eutectic aluminum-silicon alloy as recited in claim 1 wherein said silicon nitride particles are formed by ion implantation of said at least one ionic nitrogen species to an ionic dosage of at least about $5 \times 10^{17}$ ions/centimeter$^2$ as compared to the area of said surface of said article.

3. A wear resistant article formed from a hyper-eutectic aluminum-silicon alloy as recited in claim 1 wherein said silicon content ranges between about 16 to about 18 weight percent.

4. A wear resistant article formed from a hyper-eutectic aluminum-silicon alloy as recited in claim 1 wherein said silicon content ranges between about 11 to about 13 weight percent.

5. A wear resistant article formed from a hyper-eutectic aluminum-silicon alloy, said article comprising:
   a silicon content of at least about ten weight percent;
   silicon carbide particles located proximate to the surface of said article; and
   a hard aluminum-carbide matrix substantially surrounding said silicon carbide particles;

said silicon carbide particles being formed by ion implantation of at least one ionic carbon species into said surface of said article, wherein said implanted ionic carbon specie sufficiently reacts with said silicon to form said silicon carbide particle, and said implanted ionic carbon specie also sufficiently reacting with the aluminum matrix to form said hard aluminum-carbide matrix which substantially surrounds said silicon carbide particles, such that said article exhibits enhanced wear resistance.

6. A wear resistant article formed from a hyper-eutectic aluminum-silicon alloy as recited in claim 5 wherein said silicon carbide particles are formed by ion implantation of said at least one ionic carbon species to an ionic dosage of at least about $5 \times 10^{17}$ ions/centimeter$^2$ as compared to the area of said surface of said article.

7. A wear resistant article formed from a hyper-eutectic aluminum-silicon alloy as recited in claim 5 wherein said silicon content ranges between about 16 to about 18 weight percent.

8. A wear resistant article formed from a hyper-eutectic aluminum-silicon alloy as recited in claim 5 wherein said silicon content ranges between about 11 to about 13 weight percent.

* * * * *